US012317617B2

(12) United States Patent
Hirota

(10) Patent No.: US 12,317,617 B2
(45) Date of Patent: May 27, 2025

(54) SOLID-STATE IMAGING DEVICE AND ELECTRONIC EQUIPMENT

(71) Applicant: SONY SEMICONDUCTOR SOLUTIONS CORPORATION, Kanagawa (JP)

(72) Inventor: Isao Hirota, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 28 days.

(21) Appl. No.: 18/447,882

(22) Filed: Aug. 10, 2023

(65) Prior Publication Data

US 2024/0030244 A1    Jan. 25, 2024

Related U.S. Application Data

(63) Continuation of application No. 16/732,003, filed on Dec. 31, 2019, now Pat. No. 11,728,357, which is a
(Continued)

(30) Foreign Application Priority Data

Jul. 22, 2014  (JP) ................. 2014-148837

(51) Int. Cl.
*H04N 23/67*  (2023.01)
*G02B 7/34*  (2021.01)
(Continued)

(52) U.S. Cl.
CPC ............. *H10F 39/803* (2025.01); *G02B 7/34* (2013.01); *G02B 7/38* (2013.01); *G02B 13/0085* (2013.01);
(Continued)

(58) Field of Classification Search
CPC .......... G02B 7/34; G02B 7/38; H04N 23/672; H04N 23/673; H04N 25/704; H10F 39/191
See application file for complete search history.

(56) References Cited

U.S. PATENT DOCUMENTS 10,554,874 B2    2/2020   Hirota
2005/0205901 A1  9/2005   Suzuki
(Continued)

FOREIGN PATENT DOCUMENTS

JP    S57-37336      3/1982
JP    2010-239337    10/2010
(Continued)

OTHER PUBLICATIONS

International Search Report for International (PCT) Patent Application No. PCT/JP2015/069827, dated Sep. 8, 2015, 3 pages.
(Continued)

*Primary Examiner* — Tucker J Wright
(74) *Attorney, Agent, or Firm* — Sheridan Ross PC

(57) ABSTRACT

The present disclosure relates to a solid-state imaging device and electronic equipment that enable improvement of image quality of a captured image. In the solid-state imaging device, two or more photoelectric conversion layers including a photoelectric converter and a charge detector are laminated. The solid-state imaging device is configured to include a state in which light having entered one pixel of a first photoelectric conversion layer closer to an optical lens is received by the photoelectric converter of a plurality of pixels of the second photoelectric conversion layer farther from the optical lens. The technology of the present disclosure can be applied to, for example, a solid-state imaging device that performs imaging.

20 Claims, 14 Drawing Sheets

Related U.S. Application Data continuation of application No. 15/325,768, filed as application No. PCT/JP2015/069827 on Jul. 10, 2015, now Pat. No. 10,554,874.

(51) Int. Cl.

| | | |
|---|---|---|
| *G02B 7/38* | (2021.01) | |
| *G02B 13/00* | (2006.01) | |
| *H04N 25/704* | (2023.01) | |
| *H10F 39/00* | (2025.01) | |
| *H10F 39/12* | (2025.01) | |
| *H10F 39/18* | (2025.01) | |
| *G03B 13/36* | (2021.01) | |

(52) U.S. Cl.
CPC ......... *H04N 23/672* (2023.01); *H04N 23/673* (2023.01); *H04N 25/704* (2023.01); *H10F 39/182* (2025.01); *H10F 39/191* (2025.01); *H10F 39/8027* (2025.01); *H10F 39/806* (2025.01); *H10F 39/8063* (2025.01); *G03B 13/36* (2013.01)

(56) References Cited

U.S. PATENT DOCUMENTS

| | | |
|---|---|---|
| 2006/0197172 A1 | 9/2006 | Oda |
| 2008/0246107 A1 | 10/2008 | Maehara |
| 2009/0072122 A1 | 3/2009 | Tada et al. |
| 2009/0090841 A1 | 4/2009 | Kusaka |
| 2010/0123070 A1 | 5/2010 | Natori |
| 2010/0328503 A1 | 12/2010 | Shintani et al. |
| 2011/0018042 A1 | 1/2011 | Lee et al. |
| 2011/0109776 A1 | 5/2011 | Kawai |
| 2011/0234884 A1 | 9/2011 | Shintani et al. |
| 2011/0304753 A1 | 12/2011 | Shintani et al. |
| 2012/0199930 A1 | 8/2012 | Hayashi |
| 2013/0182173 A1 | 7/2013 | Murata |
| 2013/0234029 A1 | 9/2013 | Bikumandla |
| 2015/0146056 A1 | 5/2015 | Hirota |
| 2018/0063410 A1 | 3/2018 | Izumi |
| 2020/0162661 A1 | 5/2020 | Hirota |

FOREIGN PATENT DOCUMENTS

| | | |
|---|---|---|
| JP | 2011-253861 | 12/2011 |
| JP | 2013-145292 | 7/2013 |
| JP | 2013-187475 | 9/2013 |
| JP | 2013-205516 | 10/2013 |
| JP | 2013-247548 | 12/2013 |
| JP | 2014-011417 | 1/2014 |
| JP | 2013-070030 | 7/2014 |
| JP | 2014-130890 | 7/2014 |
| JP | 2014-232761 | 12/2014 |
| JP | 2015-128131 | 7/2015 |
| KR | 101334219 | 11/2013 |
| WO | WO 2012/042963 | 4/2012 |

OTHER PUBLICATIONS

Official Action for U.S. Appl. No. 15/325,768, dated Apr. 5, 2018, 13 pages.
Official Action for U.S. Appl. No. 15/325,768, dated Nov. 14, 2018, 14 pages.
Official Action for U.S. Appl. No. 15/325,768, dated Apr. 5, 2019, 13 pages.
Notice of Allowance for U.S. Appl. No. 15/325,768, dated Sep. 25, 2019, 8 pages.
Official Action for U.S. Appl. No. 16/732,003, dated Apr. 20, 2022, 7 pages.
Official Action for U.S. Appl. No. 16/732,003, dated Aug. 29, 2022, 9 pages.
Official Action for U.S. Appl. No. 16/732,003, dated Dec. 21, 2022, 7 pages.
Notice of Allowance for U.S. Appl. No. 16/732,003, dated Mar. 23, 2023, 8 pages.

SOLID-STATE IMAGING DEVICE AND ELECTRONIC EQUIPMENT

CROSS REFERENCE TO RELATED APPLICATIONS

This application is a continuation of U.S. patent application Ser. No. 16/732,003, filed 31 Dec. 2019, which is a continuation of U.S. patent application Ser. No. 15/325,768, filed 12 Jan. 2017, now U.S. Pat. No. 11,728,357, which is a national stage application under 35 U.S.C. 371 and claims the benefit of PCT Application No. PCT/JP2015/069827 having an international filing date of 10 Jul. 2015, which designated the United States, which PCT application claimed the benefit of Japanese Patent Application No. 2014-148837 filed 22 Jul. 2014, the disclosures of which are incorporated herein by reference in their entirety.

TECHNICAL FIELD

The present disclosure relates to a solid-state imaging device and electronic equipment, and especially relates to a solid-state imaging device and electronic equipment that enable improvement of image quality of a captured image.

BACKGROUND ART

As a photoelectric conversion device, there is an imaging device using an organic photoelectric conversion film (for example, see Patent Document 1). The organic photoelectric conversion film can perform color separation and light receiving at the same time with a thin film, and thus has a high aperture ratio and basically does not require an on-chip microlens.

There is also a photoelectric conversion device provided with a photodiode on a silicon layer under an organic photoelectric conversion film, and which detects a phase difference with the photodiode on the silicon layer while acquiring an image with the organic photoelectric conversion film (for example, see Patent Document 2).

CITATION LIST

Patent Document

Patent Document 1: Japanese Patent No. 5244287
Patent Document 2: Japanese Patent Application Laid-Open No. 2011-103335

SUMMARY OF THE INVENTION

Problems to be Solved by the Invention

However, in the structure disclosed in Patent Document 2, if a focusing point of the on-chip lens is set to the photodiode on the silicon layer, a radius of curvature of the on-chip lens becomes small, and oblique incident characteristics are deteriorated. Therefore, a light-receiving amount becomes smaller as an image height (distance from an optical center) becomes larger, and sensitivity nonuniformity called shading occurs.

The present disclosure has been made in view of the foregoing, and enables improvement of image quality of a captured image.

Solutions to Problems

In a solid-state imaging device according to a first aspect of the present disclosure, two or more layers of photoelectric conversion layers, each of the photoelectric conversion layers including a photoelectric converter and a charge detector, are laminated, and the solid-state imaging device includes a state in which light having entered one pixel of a first photoelectric conversion layer closer to an optical lens is received in the photoelectric converter of a plurality of pixels of a second photoelectric conversion layer farther from the optical lens.

Electronic equipment according to a second aspect of the present disclosure includes: a solid-state imaging device in which two or more layers of photoelectric conversion layers, each of the photoelectric conversion layers including a photoelectric converter and a charge detector, are laminated, and a state in which light having entered one pixel of a first photoelectric conversion layer closer to an optical lens is received in the photoelectric converter of a plurality of pixels of a second photoelectric conversion layer farther from the optical lens is included.

In the first and second aspects of the present disclosure, two or more layers of photoelectric conversion layers, each of the photoelectric conversion layers including a photoelectric converter and a charge detector, are laminated, and the solid-state imaging device includes a state in which light having entered one pixel of a first photoelectric conversion layer closer to an optical lens is received in the photoelectric converter of a plurality of pixels of a second photoelectric conversion layer farther from the optical lens.

The solid-state imaging device and the electronic equipment may be independent devices or may be modules incorporated in another device.

Effects of the Invention

According to the first and second aspects of the present disclosure, the image quality of a captured image can be improved.

Note that the effect described here is not necessarily limited, and may be any of effects described in the present disclosure.

MODE FOR CARRYING OUT THE INVENTION

Hereinafter, embodiments for implementing the present disclosure (hereinafter, referred to as embodiments) will be described. Note that description will be given in the order below.
1. First Embodiment (a configuration example in which an upper-side substrate is a front surface irradiation-type substrate)
2. Second Embodiment (a configuration example in which an upper-side substrate is a back surface irradiation-type substrate)
3. Third Embodiment (a configuration example in which photoelectric conversion films are two layers)
4. Fourth Embodiment (a configuration example configured with a three-substrate laminate structure)
5. Fifth Embodiment (a configuration example in which contrast AF is employed)
6. Application Examples to Electronic Equipment 1. First Embodiment of Solid-State Imaging Device <Configuration of Imaging Mechanism>

Figure 1:
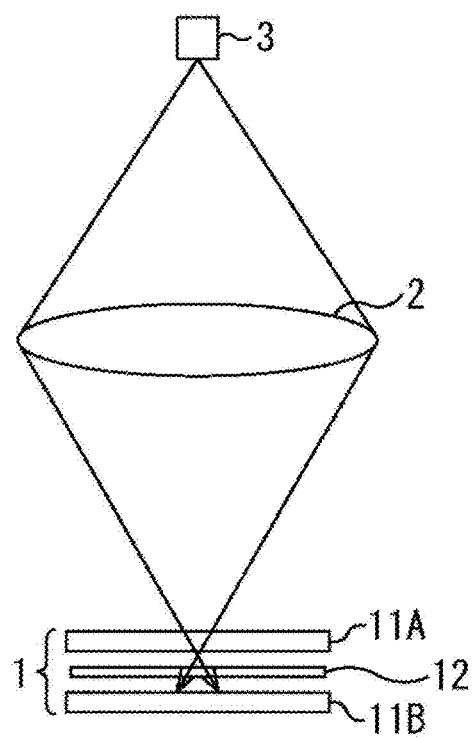
FIG. 1 is a diagram illustrating an imaging mechanism including a solid-state imaging device according to the present disclosure.

FIG. 1 is a diagram illustrating an imaging mechanism including a solid-state imaging device according to the present disclosure.

A solid-state imaging device 1 according to the present disclosure receives light of an object 3 collected by an optical lens 2, as illustrated in FIG. 1.

The solid-state imaging device 1 is a complex-type solid-state imaging device in which two semiconductor substrates 11A and 11B are laminated, for example. A photoelectric conversion layer including a photoelectric converter and a charge detector that detects a charge photoelectrically converted by the photoelectric converter is formed on each of the semiconductor substrates 11A and 11B. A semiconductor of the semiconductor substrates 11A and 11B is, for example, silicon (Si). An aperture 12 is formed between the two semiconductor substrates 11A and 11B.

Note that, hereinafter, the semiconductor substrate 11A closer to the optical lens 2, of the two semiconductor substrates 11A and 11B, is called upper-side substrate 11A, and the semiconductor substrate 11B farther from the optical lens 2 is called lower-side substrate 11B. Further, in a case where the two semiconductor substrates 11A and 11B are not especially distinguished from each other, the semiconductor substrate 11A or 11B is simply called substrate 11.

Figure 2:
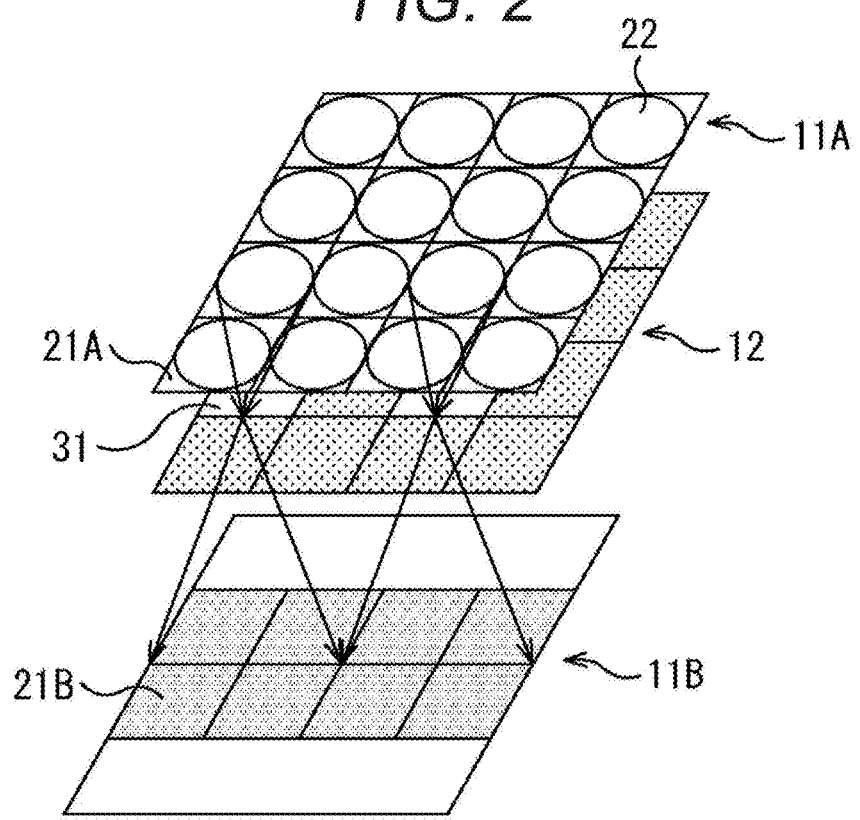
FIG. 2 is a diagram illustrating a schematic configuration of an upper-side substrate and a lower-side substrate.

FIG. 2 is a diagram illustrating a schematic configuration of the upper-side substrate 11A and the lower-side substrate 11B of the solid-state imaging device 1.

A plurality of pixels 21A is arrayed on the upper-side substrate 11A in a two-dimensional array manner. An on-chip lens 22 is formed in each of the pixels 21A. Pixel signals obtained in the plurality of pixels 21A arrayed on the upper-side substrate 11A are used as signals for image generation. Therefore, the upper-side substrate 11A functions as an image sensor.

A plurality of pixels 21B is arrayed on the lower-side substrate 11B in a two-dimensional array manner. Pixel signals obtained in the plurality of pixels 21B arrayed on the lower-side substrate 11B are used as signals for phase difference detection. Therefore, the lower-side substrate 11B functions as a phase difference detection sensor.

As illustrated in FIG. 2, opening portions 31 having one pixel size that is the same size as the pixel 21A of the upper-side substrate 11A are formed in the aperture 12 at predetermined intervals. Accordingly, there are pixels that transmit incident light to the lower-side substrate 11B and pixels that do not transmit the incident light to the lower-side substrate 11B, among the pixels 21A of the upper-side substrate 11A.

For example, as illustrated in FIG. 2, the incident light having passed through one pixel (hereinafter, referred to as transmission pixel) of the upper-side substrate 11A, the one pixel corresponding to the opening portion 31 of the aperture 12, is configured to enter 2×2 four pixels of the lower-side substrate 11B.

Figure 3:
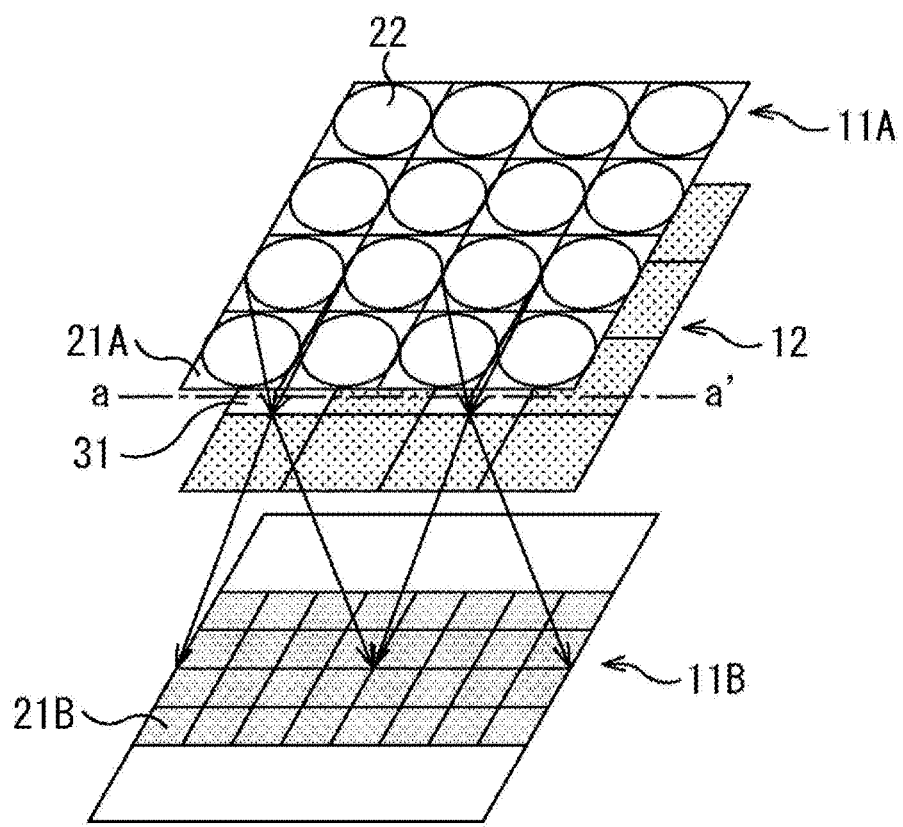
FIG. 3 is a diagram illustrating a schematic configuration of an upper-side substrate and a lower-side substrate.

Since the pixels 21B of the lower-side substrate 11B are the pixels for phase difference detection, the incident light having passed through the transmission pixel of the upper-side substrate 11A may just be configured to be received by a plurality of pixels, and may be configured to enter 4×4 sixteen pixels, for example, as illustrated in FIG. 3.

In the phase difference detection, for example, in a case where the light having passed through one transmission pixel enters the 2×2 four pixels of the lower-side substrate 11B, a focal position can be detected by comparing signals between an upper left pixel and a lower right pixel, and comparing signals between an upper right pixel and a lower left pixel, of the 2×2 four pixels.

Note that FIGS. 2 and 3 are diagrams for describing relationship between the transmission pixel of the upper-side substrate 11A, and light receiving pixels of the lower-side substrate 11B, which receive the incident light from the transmission pixel, and scales of pixel sizes of the upper-side substrate 11A and the lower-side substrate 11B are different.

In an image phase difference sensor in which phase difference pixels are arranged in a part of an image sensor having a single layer structure that is not a laminate structure, a condensing point of an on-chip lens is ideally a surface of a photodiode of a silicon layer. However, in reality, the condensing point is a deep position of the silicon layer. Therefore, a condensing point for imaging and a condensing point for phase difference detection are different, and there is a problem that obtaining an ideal condensing point and optimization of a microlens cannot be achieved at the same time.

Further, if a focusing point of the on-chip lens is set to the surface of the photodiode of the silicon layer, a radius of curvature of the on-chip lens becomes small, and oblique incident characteristics are deteriorated. Therefore, a light-receiving amount becomes smaller as an image height (distance from an optical center) becomes larger, and shading occurs.

Therefore, in the solid-state imaging device 1 according to the first embodiment, the two substrates 11 are laminated, and the pixels for phase difference detection are arranged on the lower-side substrate 11B, so that the radius of curvature of the on-chip lens can be made large, and occurrence of the shading can be suppressed.

Further, the incident light having passed through the one pixel of the upper-side substrate 11A is received by a plurality of pixels larger than 2×2 pixels. Therefore, multi-viewpoint separation becomes available, and separation performance of the phase difference pixels is improved and performance of phase difference auto focus is improved.

Figure 4:
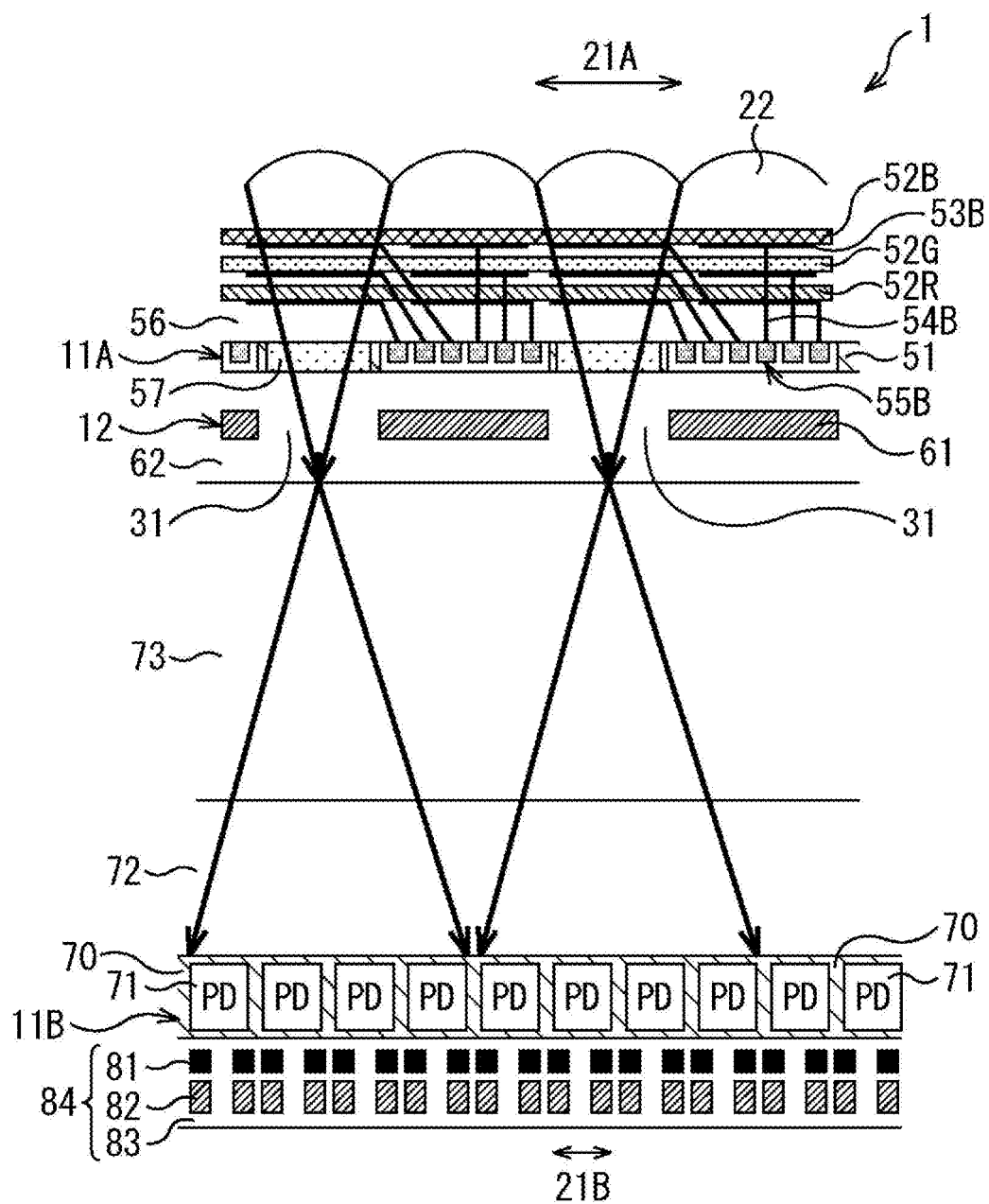
FIG. 4 is a sectional configuration diagram of a solid-state imaging device according to a first embodiment.

FIG. 4 is a sectional configuration diagram of the solid-state imaging device 1 in the a-a' line of FIG. 3.

As illustrated in FIG. 4, the solid-state imaging device 1 is configured such that the front surface irradiation-type upper-side substrate 11A and the back surface irradiation-type lower-side substrate 11B are laminated.

The upper-side substrate 11A is configured from a silicon layer 51, and light enters from above of the silicon layer 51.

Above the silicon layer 51, an on-chip lens 22 formed for each of the pixels 21A, a blue photoelectric conversion film 52B that photoelectrically converts light with a blue (B) wavelength, a green photoelectric conversion film 52G that photoelectrically converts light with a green (G) wavelength, and a red photoelectric conversion film 52R that photoelectrically converts light with a red (R) wavelength are laminated.

Transparent electrodes 53B, 53G, and 53R are respectively formed on lower surfaces of the blue photoelectric conversion film 52B, the green photoelectric conversion film 52G, and the red photoelectric conversion film 52R, for each of the pixels 21A. Further, the transparent electrodes 53B, 53G, and 53R are respectively connected with transistor circuits 55B, 55G, and 55R formed on the silicon layer 51 through connection electrodes 54B, 54G, and 54R. A top surface of the silicon layer 51 is protected by an insulating film 56.

Note that, in FIG. 4, only the transparent electrode 53B, the connection electrode 54B, and the transistor circuit 55B regarding B, of the transparent electrodes 53B, 53G, and 53R, the connection electrodes 54B, 54G, and 54R, and the transistor circuits 55B, 55G, and 55R, are illustrated with the reference signs, for prevention of complication of the drawing.

Transparent electrodes to which predetermined voltages such as a power supply voltage and a GND may be formed on respective top surfaces of the blue photoelectric conversion film 52B, the green photoelectric conversion film 52G, and the red photoelectric conversion film 52R.

The photoelectric conversion film 52 (52B, 52G, or 52R) functions as a photoelectric converter, and the transistor circuit 55 (55B, 55G, or 55R) functions as a charge detector that detects a charge photoelectrically converted in the photoelectric converter. The photoelectric conversion film 52 is formed over the entire surface of a light-receiving region. However, the transparent electrode 53 is separately formed for each of the pixels. Therefore, R, G, and B pixel signals can be acquired in units of a pixel.

The photoelectric conversion film 52 can be configured from, for example, an organic photoelectric conversion film.

As the blue photoelectric conversion film 52B that photoelectrically converts the light with a B wavelength, an organic photoelectric conversion material containing coumarin dye, tris(8-hydroxyquinolinate)Al (Alq3), merocyanine dye, or the like can be used. As the green photoelectric conversion film 52G that photoelectrically converts the light with a G wavelength, an organic photoelectric conversion material containing rhodamine dye, merocyanine dye, quinacridone, or the like can be used, for example. As the red photoelectric conversion film 52R that photoelectrically converts the light with an R wavelength, an organic photoelectric conversion material containing phthalocyanine dye can be used.

Further, the photoelectric conversion film 52 may be configured from an inorganic photoelectric conversion film. The inorganic photoelectric conversion film can be formed of, for example, a CuInSe2 (CIS-based thin film) that is a semiconductor thin film having a chalcopyrite structure, or a Cu(In, Ga)Se2 (CIGS-based thin film) that is obtained by dissolving Ga to the CuInSe2.

A metal film 61 as the aperture 12 is formed below the silicon layer 51, and the opening portions 31 are formed in portions of the transmission pixels, of the metal film 61. The metal film 61 is covered with a protection film 62.

Further, a transparent layer 57 that fully transmits the incident light is formed in a region of the silicon layer 51, the region corresponding to the opening portion 31. The transparent layer 57 can be formed of SiO2 that is oxidized silicon (Si), for example. When the silicon layer 51 of the transmission pixel is the transparent layer 57 that does not absorb the light, the light with all wavelengths, which has passed through the three layer-photoelectric conversion film 52, can be brought to reach the lower-side substrate 11B.

Note that, in the present embodiment, the photoelectric conversion film 52 as the photoelectric converter is formed above the silicon layer 51, and no photodiode is formed on the silicon layer 51. Therefore, the thickness of the silicon layer 51 can be formed to be extremely thin. Therefore, the light can be sufficiently transmitted through the silicon layer 51 as it is, without forming the transparent layer 57. Therefore, the silicon layer 51 as it is may be used.

The lower-side substrate 11B is configured from a silicon layer 70, and a photodiode (PD) 71 as a photoelectric converter is formed on the silicon layer 70 for each of the pixels by pn junction.

As illustrated by the solid line arrows in FIG. 4, a protection film 72 and an intermediate layer 73 are formed according to a focal distance of the on-chip lens 22 such that the light having entered the transmission pixel of the upper-side substrate 11A can enter the photodiodes 71 of four pixels of the lower-side substrate 11B. The protection film 72 can be formed of, for example, a silicon oxide film or a silicon nitride film, and the intermediate layer 73 can be formed of, for example, a glass layer. Further, the intermediate layer 73 may be formed of the same material as the protection film 72.

Since the lower-side substrate 11B is a back surface irradiation-type substrate, the lower-side substrate 11B and the upper-side substrate 11A are bonded such that a side opposite to the multilayer wiring layer 84 side formed on the silicon layer 70 faces the upper-side substrate 11A side.

The multilayer wiring layer 84 includes a plurality of transistor circuits 81 that configures a reading circuit that reads the signal charges accumulated in the photodiodes 71, one or more layers of wiring layers 82 and an interlayer insulating film 83, and the like.

In the solid-state imaging device 1 having the above-described configuration, in the upper-side substrate 11A, R, G, and B pixel signals are output in each of the pixels 21A, and the upper-side substrate 11A functions as a color image sensor. Further, in the lower-side substrate 11B, phase difference signals obtained by receiving the light having passed through the upper-side substrate 11A by the plurality of pixels 21B (multi viewpoints) are output, and the lower-side substrate 11B functions as a phase difference sensor.

In a case where the photoelectric conversion film 52 is used as the photoelectric converter in the upper-side substrate 11A, color separation and light receiving can be performed with the thin film at the same time. Therefore, an aperture ratio is high, and the on-chip lens 22 is basically unnecessary. Therefore, the on-chip lens 22 can be formed to have a long focal distance in accordance with light incident to the plurality of photodiodes 71 of the lower-side substrate 11B. Therefore, acquisition of an image signal and the phase difference signal can be realized without deteriorating the oblique incident characteristics.

That is, according to the first embodiment of the solid-state imaging device 1, deterioration of the oblique incident characteristics can be suppressed, and occurrence of shading can be decreased. Therefore, image quality of a captured image can be improved.

In the solid-state imaging device 1, which region of which pixels of the lower-side substrate 11b the incident light having passed through the transmission pixel of the upper-side substrate 11A enters can be arbitrarily adjusted by making an interval between the transmission pixels of the upper-side substrate 11A large (thinning), by adjusting the thickness of the intermediate layer 73, or the like. For example, by realizing multi-viewpoints so that the light from one transmission pixel enters 4×4 sixteen pixels, instead of 2×2 four pixels, resolution in a distance direction (phase difference resolution) can be increased, and ranging performance can be improved.

In the upper-side substrate 11A, the photoelectric conversion is performed with the photoelectric conversion film 52 formed outside the silicon layer 51. Therefore, it is not necessary to form a photodiode on the silicon layer 51, and it is sufficient to form the transistor circuit 55 only. Therefore, the thickness of the silicon layer 51 can be made extremely thin. Accordingly, transmittance of the light with a green (G) wavelength of the silicon layer 51 can be substantially increased. Therefore, an incident light amount to the photodiodes 71 of the lower-side substrate 11B can be made large.

Further, in a case where a transmission pixel region of the silicon layer 51 of the upper-side substrate 11A is the transparent layer 57 that fully transmits the light, the incident light amount to the photodiodes 71 of the lower-side substrate 11B can be made larger.

Note that, in a case where absorptivity of the photoelectric conversion film 52 is high, and the incident light amounts of the R light, the G light, and the B light to the lower-side substrate 11B are small, near infrared light other than visible light may just be used for the phase difference detection.

Modification of First Embodiment

Figure 5:
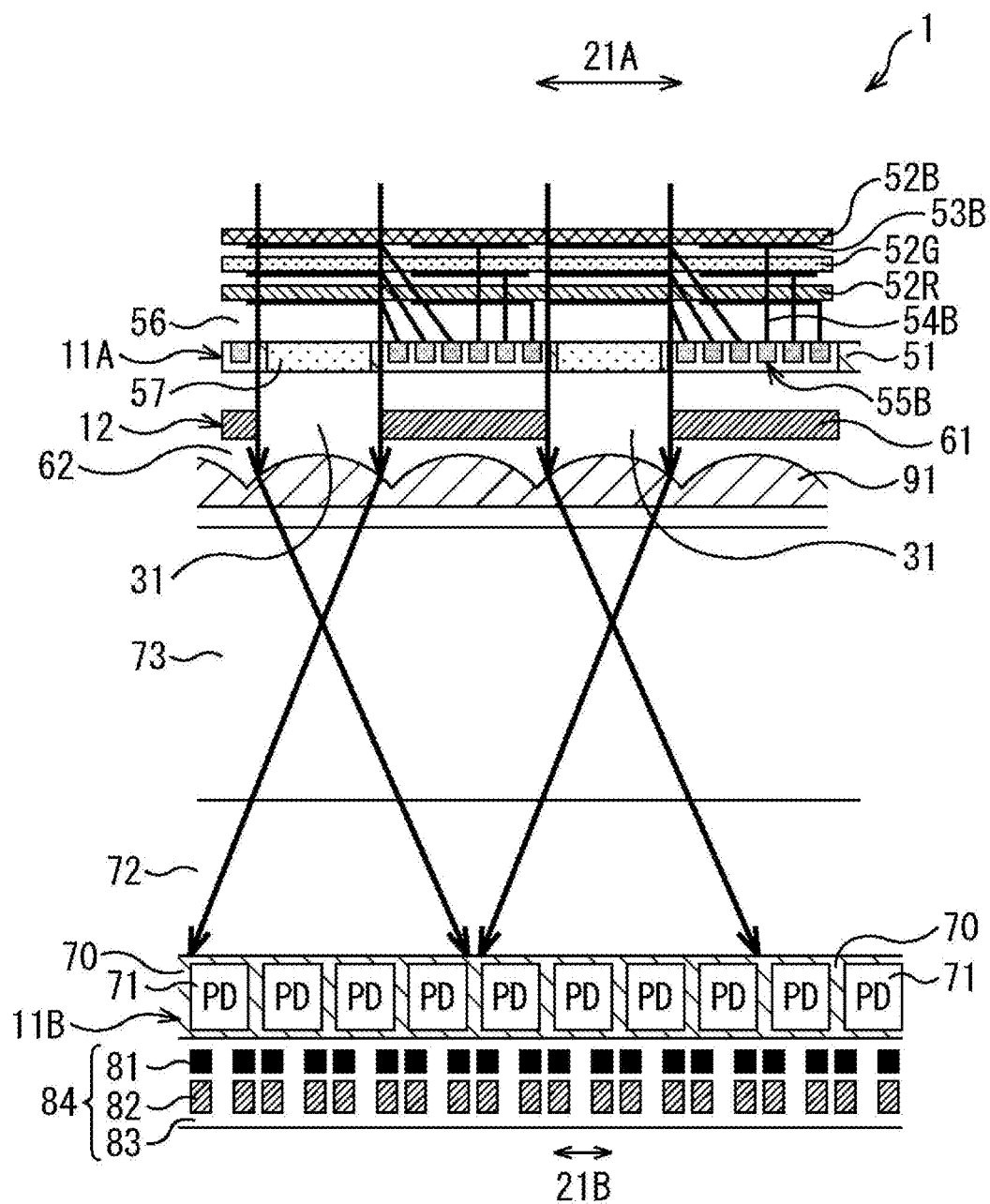
FIG. 5 is a sectional configuration diagram illustrating a modification of the first embodiment.

FIG. 5 is a sectional configuration diagram of a modification of the solid-state imaging device 1 according to the first embodiment.

Note that, in FIG. 5 and subsequent drawings, a portion corresponding to the embodiment described by then is denoted with the same reference sign, and description of the portion is appropriately omitted.

As described above, in a case of using a photoelectric conversion film 52 as a photoelectric converter of an upper-side substrate 11A, an on-chip lens 22 is unnecessary for the photoelectric conversion film 52. Therefore, the on-chip lens 22 above the laminated photoelectric conversion film 52 can be omitted as long as the solid-state imaging device 1 has some sort of structure for condensing incident light to a lower-side substrate 11B.

For example, as illustrated in FIG. 5, a structure provided with an in-layer lens 91 below an aperture 12, in place of the on-chip lens 22, and to condense the incident light to the lower-side substrate 11B with the in-layer lens 91 can be employed.

The in-layer lens 91 can be provided above the aperture 12, or can be arranged in an arbitrary layer other than above, instead of below the aperture 12. Further, the in-layer lens 91 may be formed only to a transmission pixel, and a region of a pixel where no opening portion 31 is formed may be formed flat. Similarly, the position of the aperture 12 is not limited to below a silicon layer 51, and may be above the silicon layer 51.

2. Second Embodiment of Solid-State Imaging Device

Figure 6:
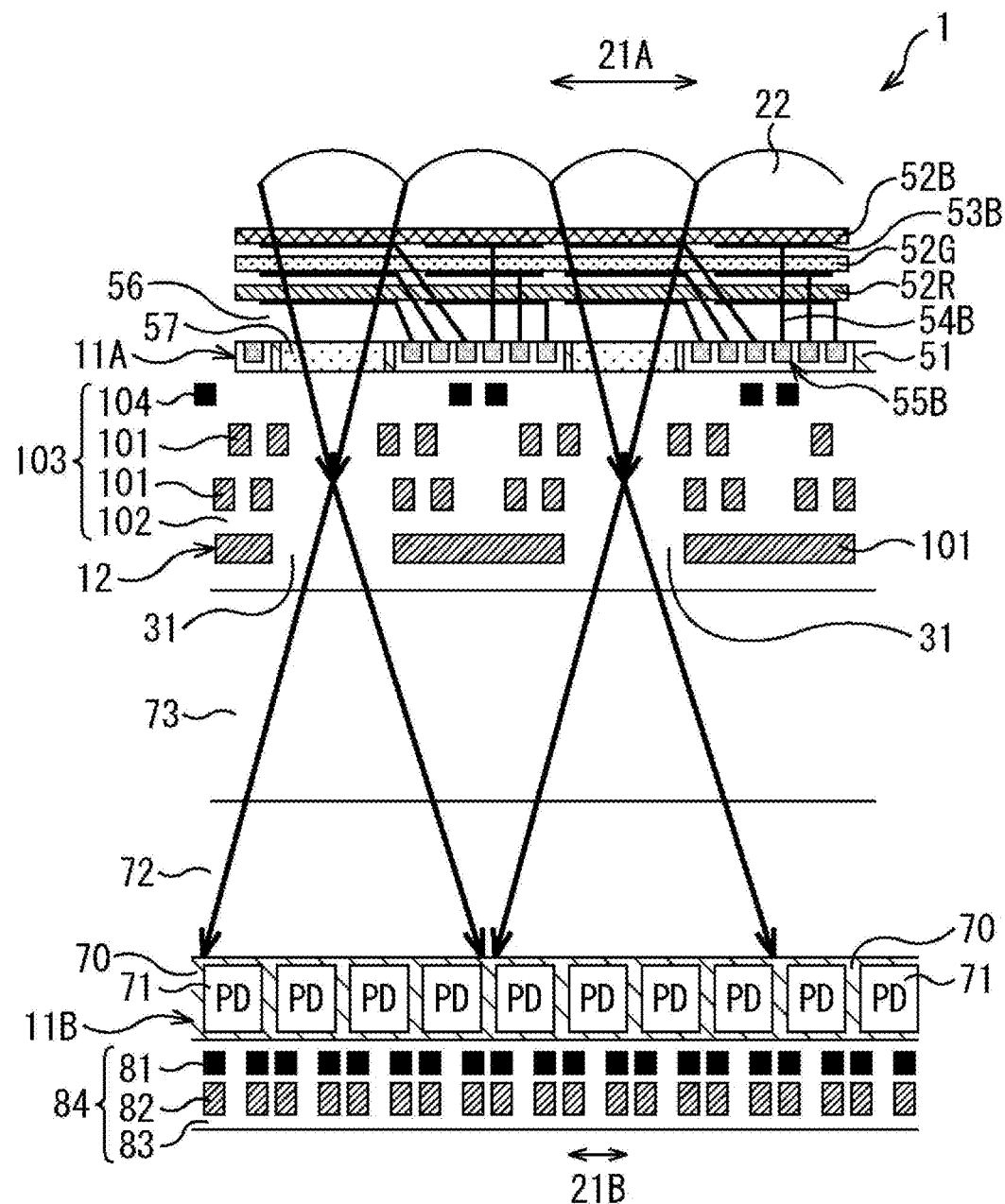
FIG. 6 is a sectional configuration diagram of a solid-state imaging device according to a second embodiment.

FIG. 6 is a sectional configuration diagram illustrating a second embodiment of a solid-state imaging device 1 according to the present disclosure.

In the sectional configuration of the first embodiment illustrated in FIG. 4, a configuration example in which the upper-side substrate 11A as a front surface irradiation-type substrate and the lower-side substrate 11B as a back surface irradiation-type substrate are laminated has been described.

However, the upper-side substrate 11A may be the back surface irradiation-type substrate, and the lower-side substrate 11B may be the front surface irradiation-type substrate. That is, as the upper-side substrate 11A and the lower-side substrate 11B, whichever of the front surface irradiation-type configuration and the back surface irradiation-type configuration may be employed.

The second embodiment illustrated in FIG. 6 is a configuration example in which both of an upper-side substrate 11A and a lower-side substrate 11B are laminated as back surface irradiation-type substrates. In other words, in the second embodiment of FIG. 6, the upper-side substrate 11A is changed to the back surface irradiation-type substrate, compared with the first embodiment of FIG. 4.

Since the upper-side substrate 11A is the back surface irradiation-type substrate, a multilayer wiring layer 103 is formed on a side (below the upper-side substrate 11A in FIG. 6) opposite to a side where light of the upper-side substrate 11A enters. The multilayer wiring layer 103 is configured from one or more layers of wiring layers 101 and an interlayer insulating film 102.

Further, in the case where the upper-side substrate 11A is the back surface irradiation-type substrate, an aperture 12 can be formed in one wiring layer 101, of the multilayer wiring layer 103, as illustrated in FIG. 6.

3. Third Embodiment of Solid-State Imaging Device

In the sectional configuration of the first embodiment illustrated in FIG. 4, one layer of the photoelectric conversion film 52 has been provided for each of R, G, and B, and the photoelectric converter has a configuration in which three layers of the photoelectric conversion films 52 are laminated.

However, the photoelectric converter is not limited to the three layers, and can be two layers, one layer, or four or more layers of the photoelectric conversion films 52.

Figure 7:
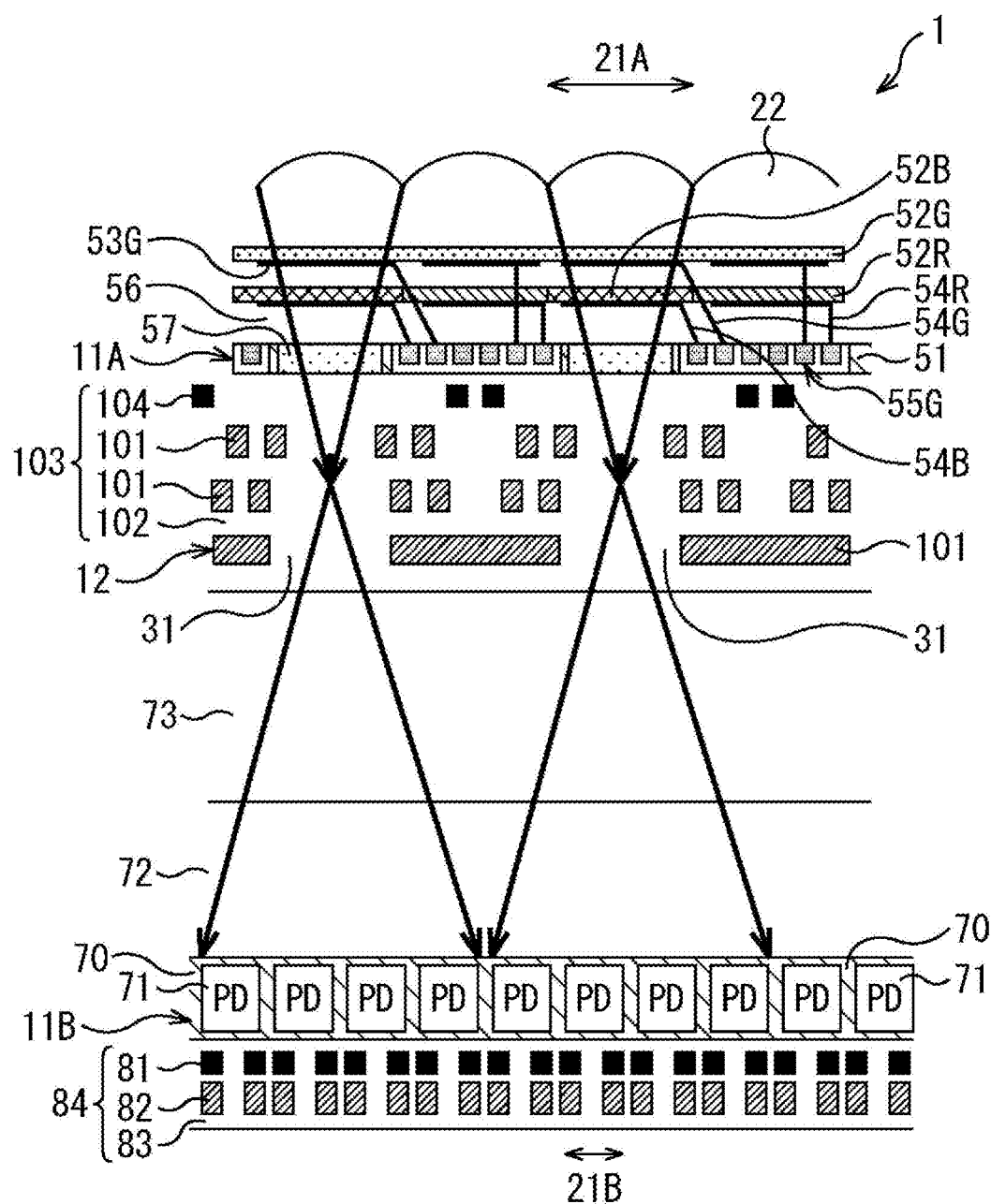
FIG. 7 is a sectional configuration diagram of a solid-state imaging device according to a third embodiment.

FIG. 7 is a sectional configuration diagram illustrating a third embodiment of a solid-state imaging device 1 according to the present disclosure, and illustrates a configuration example in which a photoelectric converter is two layers of photoelectric conversion films 52.

Note that, in FIG. 7, a part of reference signs is omitted due to limitations of space.

In the third embodiment, the two layers of the photoelectric conversion films 52 are formed above a semiconductor substrate 11A on a light incident surface side. As an upper photoelectric conversion film 52 of the two layers, a green photoelectric conversion film 52G that photoelectrically converts light with a green (G) wavelength is formed on the entire surface.

Meanwhile, as a lower photoelectric conversion film 52 of the two layers, a red photoelectric conversion film 52R that photoelectrically converts light with a red (R) wavelength and a blue photoelectric conversion film 52B that photoelectrically converts light with a Blue (B) wavelength are separately formed for each of pixels. The red photoelectric conversion film 52R and the blue photoelectric conversion film 52B are formed in a checkered manner such that colors (wavelengths) of the light to be photoelectrically converted become different between adjacent pixels in a vertical direction and in a horizontal direction, for example.

A charge photoelectrically converted by the green photoelectric conversion film 52G is taken out by a transistor circuit 55G formed on a silicon layer 51 through a transparent electrode 53G and a connection electrode 54G formed in units of a pixel.

Similarly, a charge photoelectrically converted by the blue photoelectric conversion film 52B is taken out by a transistor circuit 55B formed on the silicon layer 51 through a transparent electrode 53B and a connection electrode 54B formed in units of a pixel. The same applies to the red photoelectric conversion film 52R.

In the third embodiment, as for a transmission pixel, that is, a pixel 21A for which an opening portion 31 is formed in an aperture 12, the lower photoelectric conversion film 52, of the two layers of the photoelectric conversion films 52, is the blue photoelectric conversion film 52B that photoelectrically converts the light with a B wavelength. In this case, the light with an R wavelength, which is the light not absorbed in the upper layer-green photoelectric conversion film 52G and the lower layer-blue photoelectric conversion film 52B in the transmission pixel, enters the lower-side substrate 11B.

Therefore, in the third embodiment, phase difference detection can be performed on the basis of a light-receiving amount of the light with an R wavelength.

As described above, in a case where the red photoelectric conversion film 52R and the blue photoelectric conversion film 52B are arranged in a checkered manner on the lower layer-photoelectric conversion film 52, the pixel 21A that does not absorb the light with an R wavelength (hereinafter, referred to as R non-absorbing pixel) is arranged in every other pixel, and all of the R non-absorbing pixels can be the transmission pixels.

For example, assume a case in which there are the pixel 21A that is the transmission pixel because the opening portion 31 is arranged and the pixel 21A shaded by the aperture 12 because the opening portion 31 is not arranged, of the plurality of R non-absorbing pixels arranged in a light-receiving region.

In this case, in the pixel 21A shaded by the aperture 12, the light having passed through the two layers of the photoelectric conversion films 52 is reflected toward the side of the photoelectric conversion films 52 again by the aperture 12. However, in the pixel 21A for which the opening portion 31 is arranged, the light having passed through the two layers of the photoelectric conversion films 52 passes toward the lower-side substrate 11B. As a result, a sensitivity characteristic may differ between the transmission pixel and the pixel that is not the transmission pixel, among the same R non-absorbing pixels and its peripheral pixels.

Therefore, in the third embodiment, to prevent occurrence of a characteristic difference due to existence/non-existence of the opening portion 31, all of the R non-absorbing pixels are the transmission pixels. To be specific, all of the pixels of the two layers of the photoelectric conversion films 52 that are formed of a combination of the green photoelectric conversion films 52G and the blue photoelectric conversion films 52B. In the lower layer-photoelectric conversion film 52, the blue photoelectric conversion film 52B is arranged at intervals of one pixel. Therefore, all of the R non-absorbing pixels can be the transmission pixels. Accordingly, in the third embodiment, the problem that the sensitivity characteristic differs between the same pixels where the color (wavelength) of the incident light to be photoelectrically converted is the same does not occur.

However, to put it the other way around, in the third embodiment, arrangement of the transmission pixels is limited to the pixels 21A in the combination of the green photoelectric conversion films 52G and the blue photoelectric conversion films 52B.

In contrast, in a case of a configuration in which three layers of the photoelectric conversion films 52 corresponding to R, G, and B are laminated, like the first and second embodiments, the wavelength of light to be photoelectrically converted is common among all of the pixels. Therefore, which of the pixels can be the transmission pixel, and arrangement (pitch) of the transmission pixels in the light-receiving region can be arbitrarily set.

Note that, in the above-described example, the pixel 21A in which the blue photoelectric conversion film 52B is formed, of the lower layers of the red photoelectric conversion film 52R and the blue photoelectric conversion film 52B arranged in a checkered manner, has been the transmission pixel. However, the pixel 21A in which the red photoelectric conversion film 52R is formed may be the transmission pixel. In this case, the light with a B wavelength enters the lower-side substrate 11B, and the phase difference detection is performed on the basis of a light-receiving amount of the B light.

Further, the upper photoelectric conversion film 52, of the two layers of the photoelectric conversion films 52, may be the blue photoelectric conversion film 52B that photoelectrically converts the light with a B wavelength, or the red photoelectric conversion film 52R that photoelectrically converts the light with an R wavelength. The wavelength of the light to be photoelectrically converted in the lower photoelectric conversion film 52 can also appropriately changed in accordance with the wavelength of the light to be photoelectrically converted in the upper photoelectric conversion film 52. That is, which light with a wavelength being photoelectrically converted in which layer, in the two layers of the photoelectric conversion films 52, can be appropriately determined.

The arrangement of the lower two-color photoelectric conversion film 52 in the checkered manner in the third embodiment can also be appropriately determined.

Circuit Arrangement Configuration Examples in Two Layer-Structure

Figure 8A:
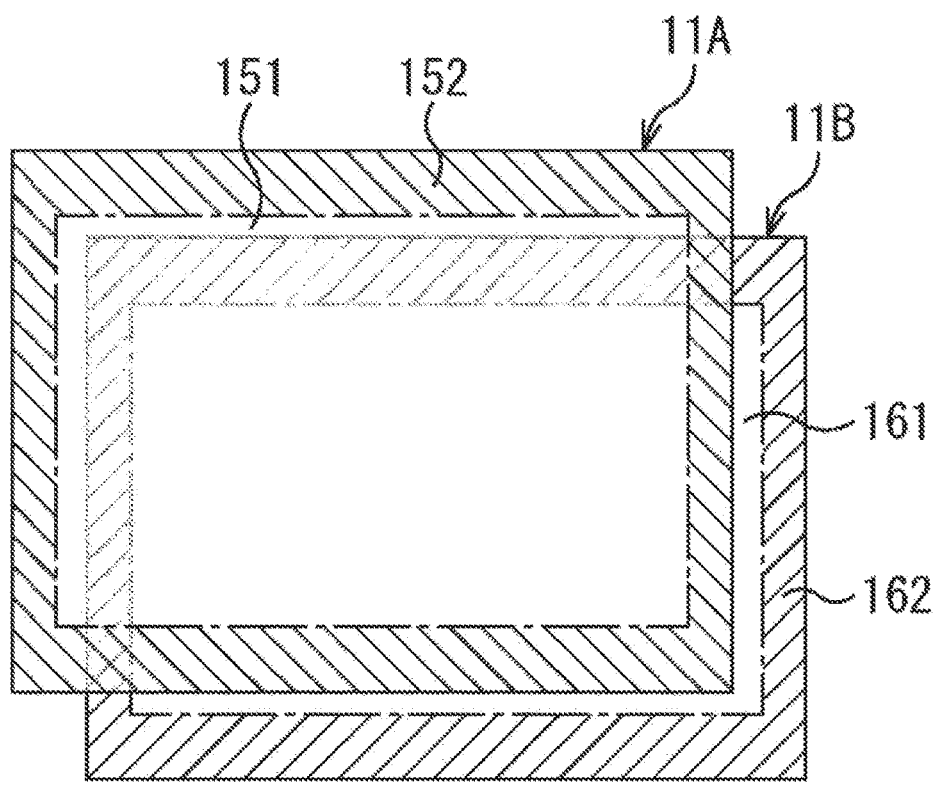
FIGS. 8A and 8B are diagrams illustrating circuit arrangement configuration examples of a solid-state imaging device having a two-layer laminate structure.
Figure 8B:
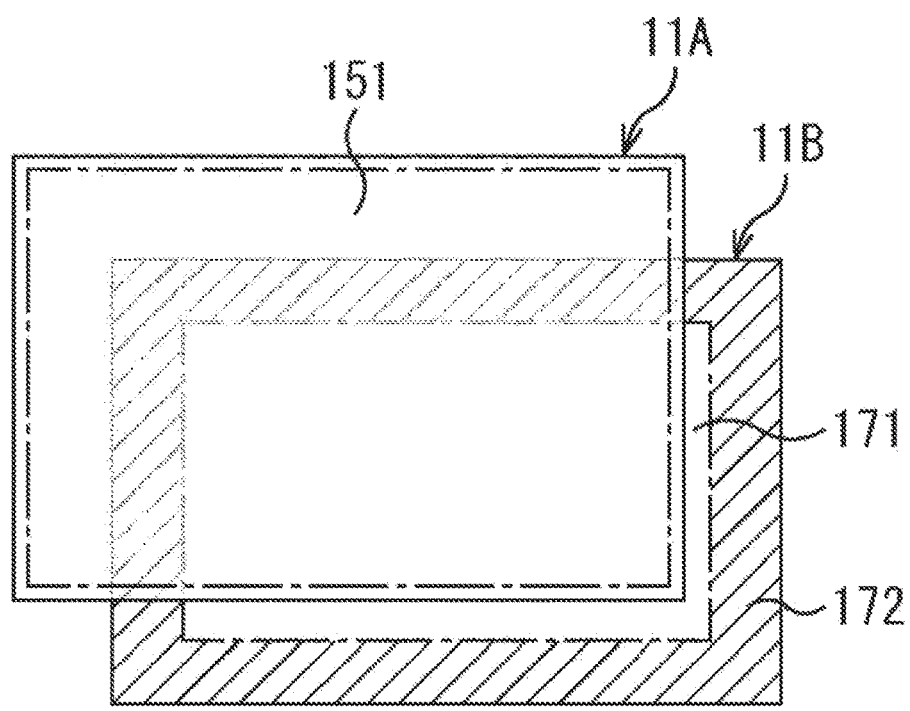

FIGS. 8A and 8B illustrate circuit arrangement configuration examples of the respective substrates 11 of the upper-side substrate 11A and the lower-side substrate 11B.

A of FIG. 8 illustrates a circuit arrangement configuration example in which a cover rate of the phase difference sensor region of the lower-side substrate 11B to a light-receiving region 151 of the upper-side substrate 11A is 100%, where the light-receiving region 151 of the upper-side substrate 11A and a light-receiving region 161 of the lower-side substrate 11B have the same size. In this case, a circuit region 152 of the upper-side substrate 11A and a circuit region 162 of the lower-side substrate 11B have the same size. For example, in a case where the solid-state imaging device 1 has an APS-C size, the light-receiving region 151 has a size of about 15.75 mm×23.6 mm.

B of FIG. 8 illustrates a circuit arrangement configuration example of the substrates 11 of the upper-side substrate 11A and the lower-side substrate 11B of a case where one chip size is reduced as much as possible without decreasing light-receiving sensitivity of the image sensor.

Only the light-receiving region 151 is formed on the upper-side substrate 11A.

Meanwhile, on the lower-side substrate 11B, a light-receiving region 171 as a phase difference sensor region, and a circuit region 172 are formed. In the circuit region 172, the circuits of the circuit region 152 of the upper-side substrate 11A and the circuit region 162 of the lower-side substrate 11B in A of FIG. 8 are collectively arranged. Therefore, the size of the circuit region 172 is larger than the size of the circuit region 162 of the lower-side substrate 11B in A of FIG. 8. However, as the cover rate of the phase difference sensor region of the lower-side substrate 11B to the light-receiving region 151 of the upper-side substrate 11A, at least 80% can be secured.

Circuit Arrangement Configuration Example in Three Layer-Structure

Further, the solid-state imaging device 1 can also be configured with a laminate structure of three or more substrates 11, in addition to by the above-described laminate structure with the two substrates 11.

Figure 9:
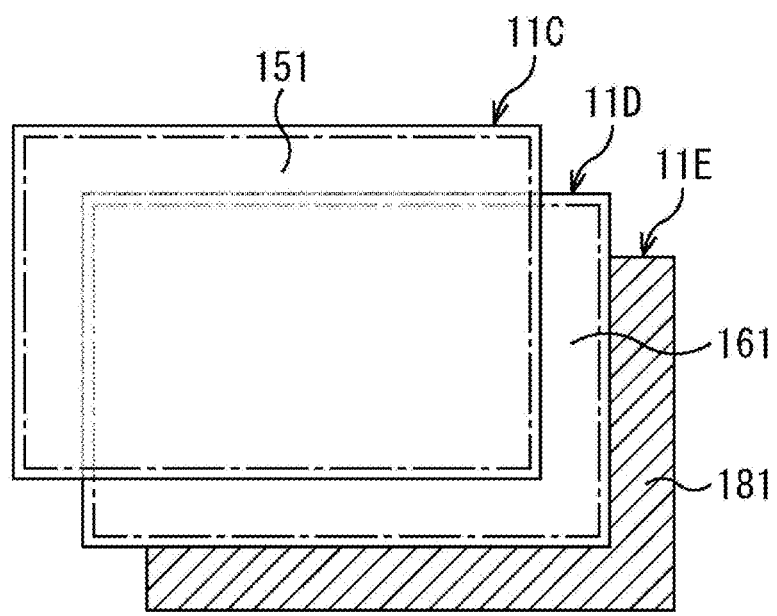
FIG. 9 is a diagram illustrating a circuit arrangement configuration example of a solid-state imaging device having a three-layer laminate structure.

FIG. 9 illustrates a circuit arrangement configuration example of the substrates 11 in a case where the solid-state imaging device 1 is configured with a laminate structure of three substrates 11.

Only a light-receiving region 151 is formed on an upper-side substrate 11C serving as an uppermost layer of the three layer-structure, and a light-receiving region 161 is formed on an intermediate substrate 11D serving as an intermediate layer, the light-receiving region 161 having the same size as the light-receiving region 151, and having a cover rate of a phase difference sensor region to the light-receiving region 151 of the upper-side substrate 11C of 100%.

A circuit region 181 is formed on a lower-side substrate 11E serving as a lowermost layer of the three layer-structure.

By causing the solid-state imaging device 1 to have the three-layer structure, as described above, the chip size can be reduced compared with the solid-state imaging device 1 having the two-layer laminate structure of A of FIG. 8, yet the same APS-C size. Further, a larger cover rate of the phase difference sensor region can be secured than that of the solid-state imaging device 1 by the two-layer laminate structure of B of FIG. 8.

Further, the entire region of the lower-side substrate 11E serving as the lowermost layer can be used as the circuit region 181. Therefore, an analog-digital converter (ADC), a logic circuit, a memory, and the like can be arranged on the circuit region 181 of the lower-side substrate 11E, in addition to a drive circuit that drives pixels of the light-receiving region 151 of the upper-side substrate 11C and the light-receiving region 161 of the intermediate substrate 11E.

Further, in a case where a circuit is arranged on the lower-side substrate 11E serving as the lowermost layer to process signal processing of an image sensor of the uppermost layer and signal processing of a phase different sensor of the intermediate layer in parallel, a detection speed of phase difference auto focus can be improved.

4. Fourth Embodiment of Solid-State Imaging Device

Configuration Example 1 of Three Layer-Structure

Figure 10:
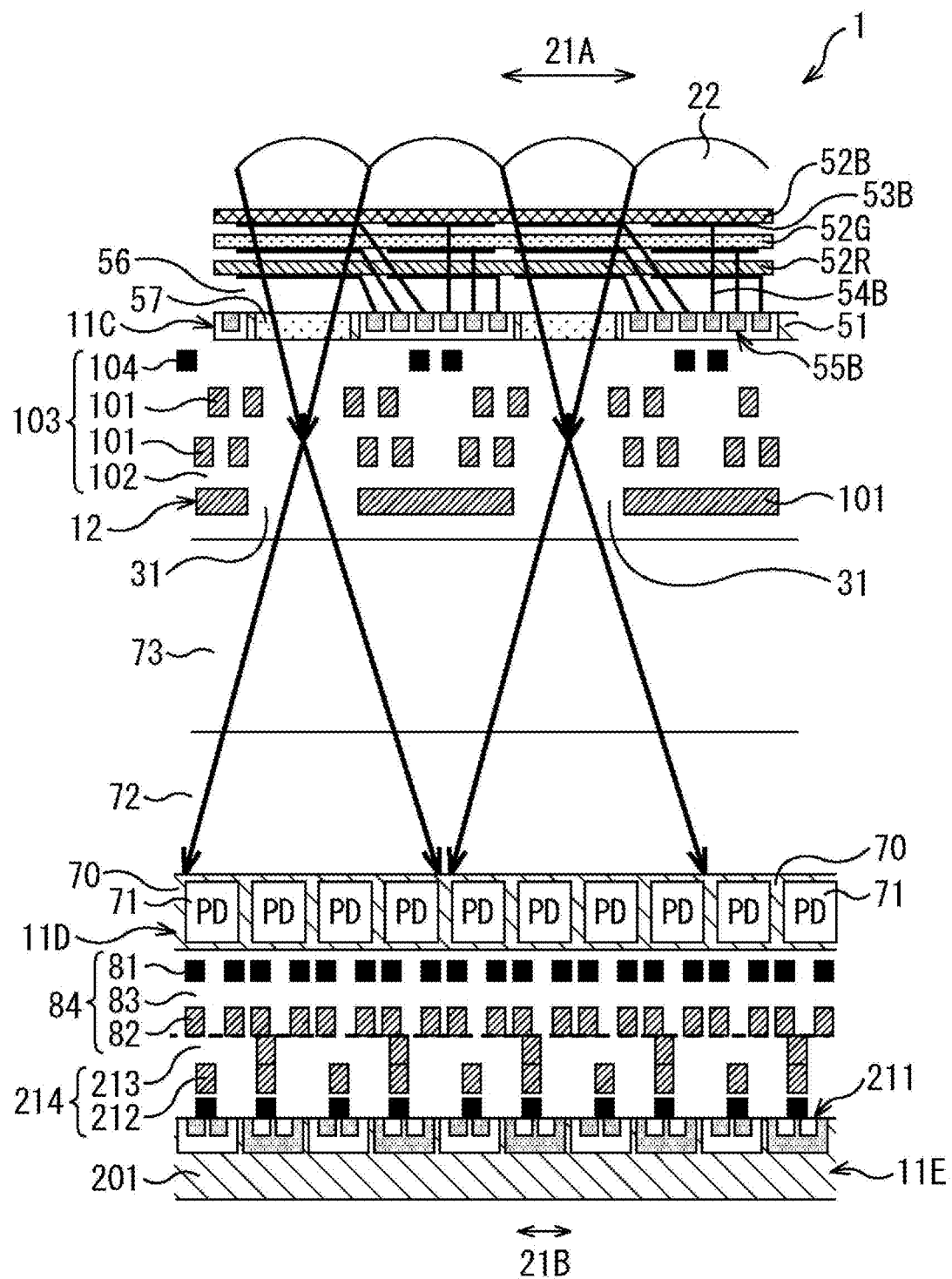
FIG. 10 is a sectional configuration diagram of a solid-state imaging device having a three-layer laminate structure.

FIG. 10 illustrates a sectional configuration diagram of a case where a solid-state imaging device 1 is configured with a laminate structure of three substrates 11, which is a fourth embodiment of the solid-state imaging device 1.

An upper-side substrate 11C and an intermediate substrate 11D correspond to the upper-side substrate 11A and the lower-side substrate 11B of the solid-state imaging device 1 including the three layers of the photoelectric conversion films 52 illustrated in FIG. 6, and thus description is omitted. The upper-side substrate 11C and the intermediate substrate 11D are bonded to become back surface irradiation-type substrates.

Then, a multilayer wiring layer 84 of the intermediate substrate 11D and a multilayer wiring layer 214 of the lower-side substrate 11E are bonded by Cu—Cu metal coupling, for example. The multilayer wiring layer 214 is configured from one or more wiring layers 212 and an interlayer insulating film 213. In FIG. 10, the broken line between the wiring layer 82 and the wiring layer 212 illustrates a bonding surface between the intermediate substrate 11D and the lower-side substrate 11E.

A signal processing circuit including a plurality of transistor circuits 211 and the like is formed on a silicon layer 201 of the lower-side substrate 11E.

Configuration Example 2 of Three Layer-Structure

Figure 11:
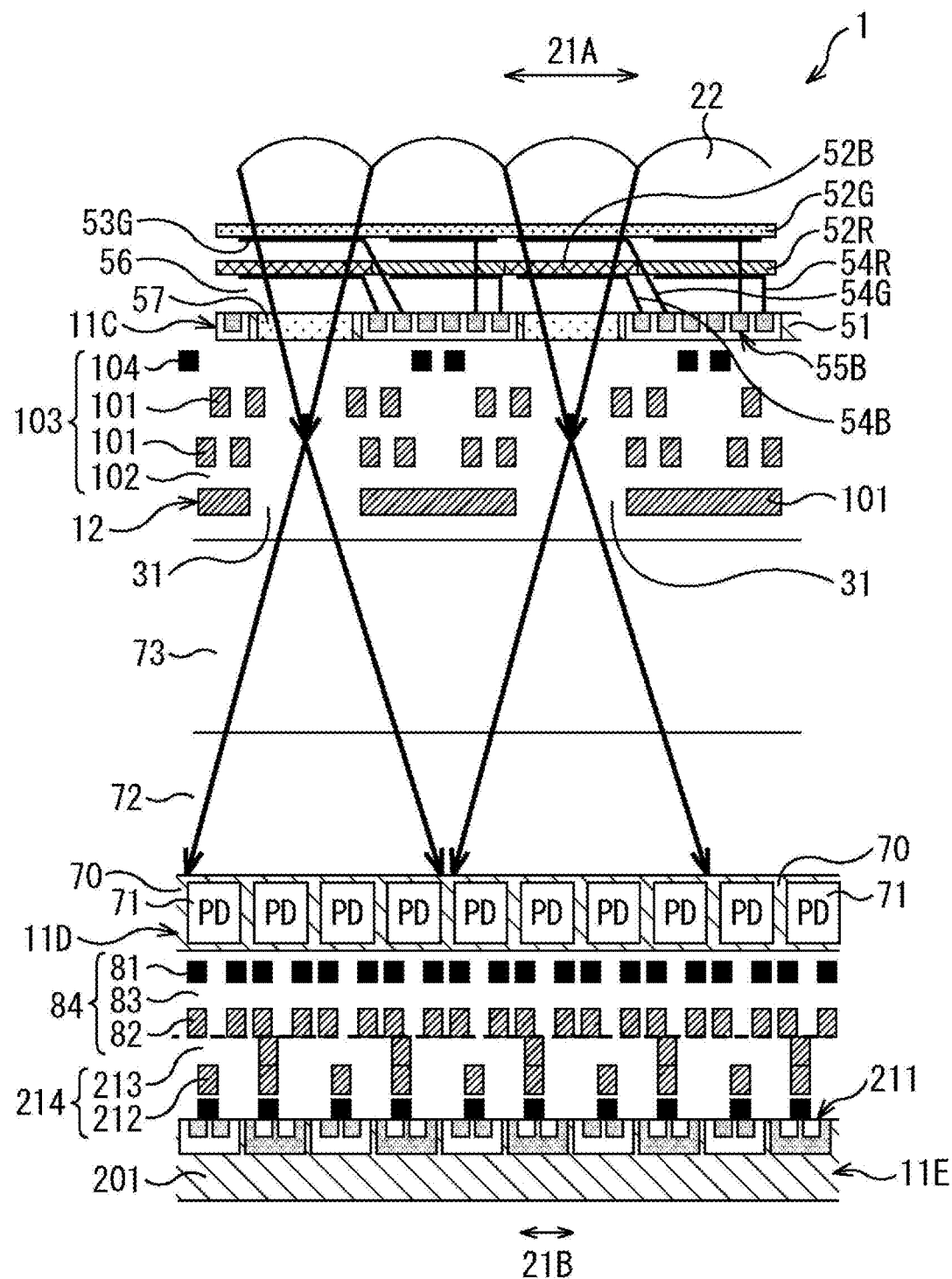
FIG. 11 is another sectional configuration diagram of the solid-state imaging device having a three-layer laminate structure.

FIG. 11 illustrates another sectional configuration diagram of a case where the solid-state imaging device 1 is configured with a laminate structure of three substrates 11.

An upper-side substrate 11C and an intermediate substrate 11D correspond to the upper-side substrate 11A and the lower-side substrate 11B of the solid-state imaging device 1 including the two layers of the photoelectric conversion films 52 illustrated in FIG. 7, and thus description is omitted. The upper-side substrate 11C and the intermediate substrate 11D are bonded to become back surface irradiation-type substrates.

Then, a multilayer wiring layer 84 of the intermediate substrate 11D and a multilayer wiring layer 214 of the lower-side substrate 11E are bonded by Cu—Cu metal coupling, for example. The multilayer wiring layer 214 is configured from one or more wiring layers 212 and an interlayer insulating film 213. In FIG. 11, the broken line between the wiring layer 82 and the wiring layer 212 illustrates a bonding surface between the intermediate substrate 11D and the lower-side substrate 11E.

A signal processing circuit including a plurality of transistor circuits 211 and the like is formed on a silicon layer 201 of the lower-side substrate 11E.

5. Fifth Embodiment of Solid-State Imaging Device

The first to third embodiments described above have referred to the configuration in which the pixel signal obtained in the upper-side substrate 11A is used as the signal to obtain a captured image, and the pixel signal obtained in the lower-side substrate 11B is used as the signal to perform the phase difference detection.

Hereinafter, a configuration in which a contrast method of performing focus control on the basis of a contrast difference between pixel signals detected in two substrates 11 is employed, instead of phase difference detection, as focus control, will be described.

<Focus Control of Contrast Method>

Figure 12:
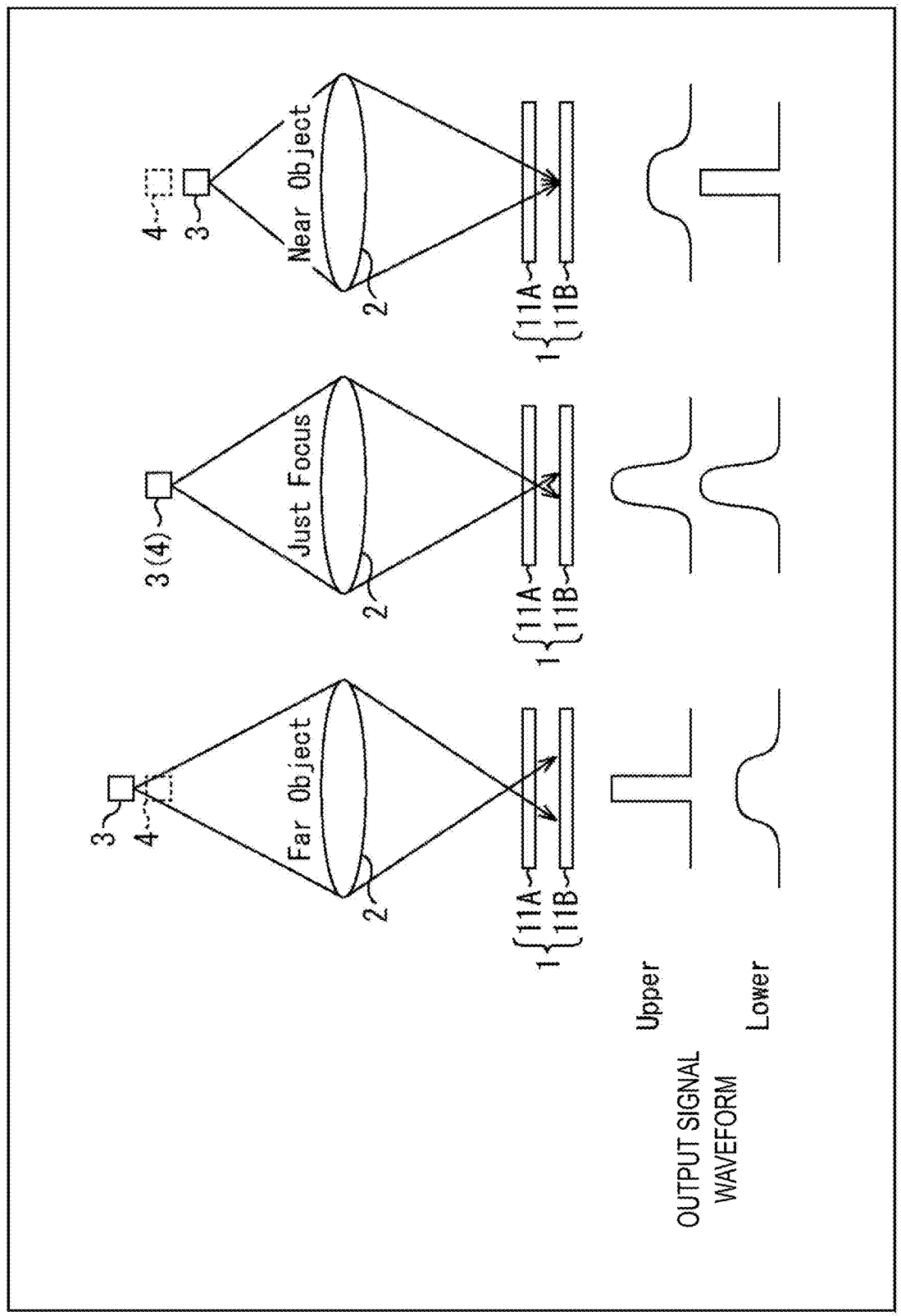
FIG. 12 is a diagram for describing focus control of a contrast method.

FIG. 12 is a diagram for describing focus control of a contrast method performed by the solid-state imaging device 1.

In a state of Far Object illustrated in the left side of FIG. 12, that is, in a state where an object 3 is farther than a focal position 4, contrast of an image obtained in an upper-side substrate 11A becomes stronger than contrast of an image obtained in a lower-side substrate 11B.

In contrast, in a state of Near Object illustrated in the right side of FIG. 12, that is, in a state where the object 3 is closer than the focal position 4, the contrast of the image obtained in the lower-side substrate 11B becomes stronger than the contrast of the image obtained in the upper-side substrate 11A.

Then, in a state of Just Focus illustrated in the center of FIG. 12, that is, in a state where the position of the focal position 4 and the position of the object 3 are matched, the contrast of the image obtained in the upper-side substrate 11A and the contrast of the image obtained in the lower-side substrate 11B are matched.

As described above, a difference occurs between the contrast of the image obtained in the upper-side substrate 11A and the contrast of the image obtained in the lower-side substrate 11B according to the focal position. Therefore, the focus control can be performed by comparing the contrast of the image obtained in the upper-side substrate 11A and the contrast of the image obtained in the lower-side substrate 11B.

Further, an auto focus adjusting direction can be obtained by detecting which of the contrast of the image obtained in the upper-side substrate 11A and the contrast of the image obtained in the lower-side substrate 11B is stronger. Therefore, auto focus can be performed at a high speed.

Further, the distance to the object 3 can be estimated from the difference between the contrast of the image obtained in the upper-side substrate 11A and the contrast of the image obtained in the lower-side substrate 11B, and the focus position can be adjusted by one time imaging.

Figure 13:
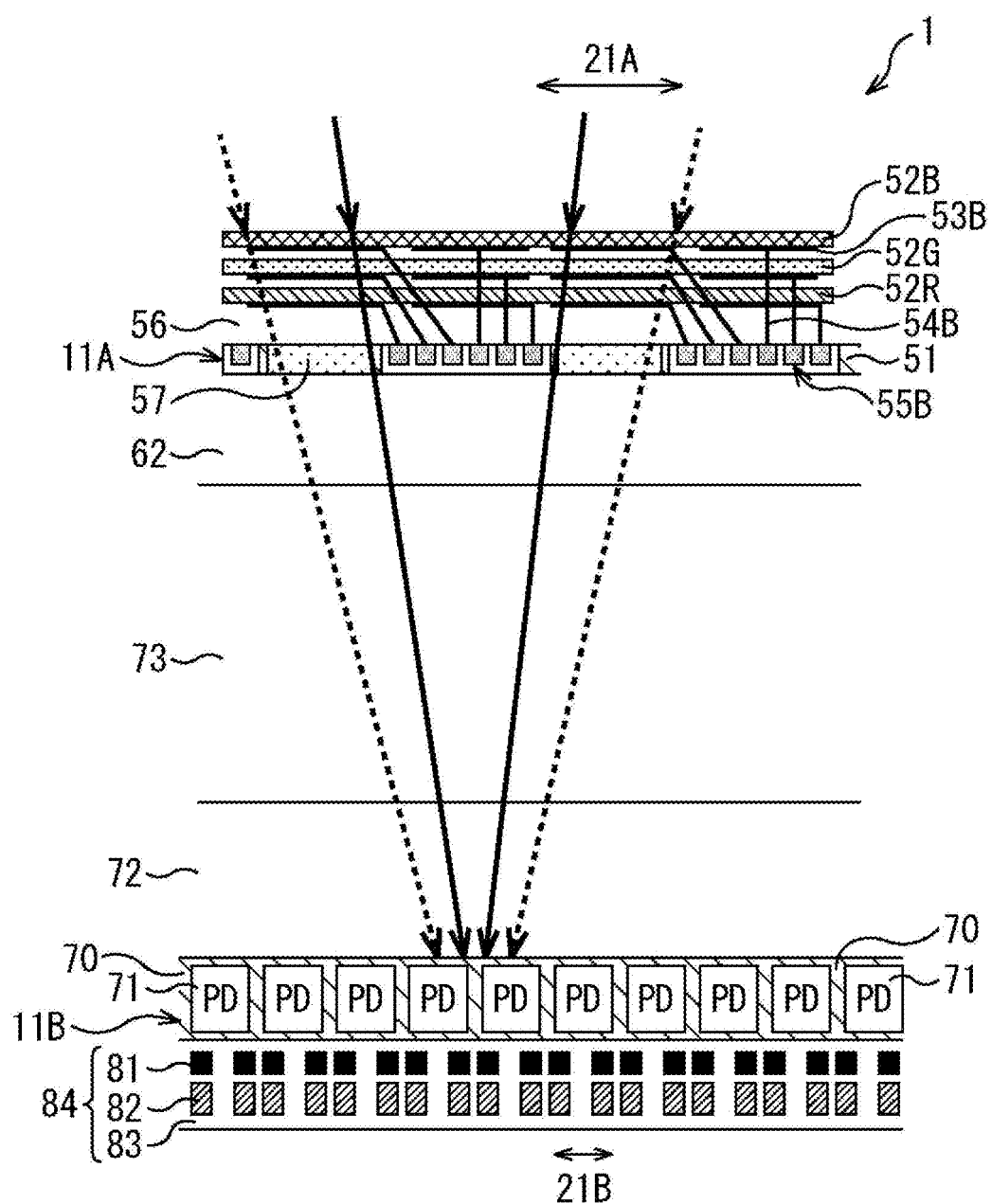
FIG. 13 is a sectional configuration diagram of a solid-state imaging device according to a fourth embodiment.

FIG. 13 is a sectional configuration diagram illustrating a fifth embodiment of a solid-state imaging device 1 according to the present disclosure, and illustrates a configuration example of a case of performing focus control by the contrast method.

In FIG. 13, a portion corresponding to the first embodiment illustrated in FIG. 4 is denoted with the same reference sign, and only portions different from the first embodiment will be described.

Comparing the configuration according to the fifth embodiment illustrated in FIG. 13 with the configuration according to the first embodiment illustrated in FIG. 4, the fifth embodiment is different from the first embodiment in that an on-chip lens 22 and an aperture 12 (metal film 61) are not formed.

As described above, in a case where a photoelectric converter of the upper-side substrate 11A is configured from a photoelectric conversion film 52, the on-chip lens 22 is not necessary. Further, the fifth embodiment may just be configured such that incident light forms an image on a top surface of a photodiodes 71 of the lower-side substrate 11B with an optical lens 2 (FIG. 1), and the on-chip lens 22 is unnecessary even in light receiving of the lower-side substrate 11B.

Further, in a case of performing phase difference detection, a plurality of pixels of the lower-side substrate 11B corresponds to one transmission pixel. Therefore, pixels 21A other than the transmission pixel need to be shaded by apertures 12. However, in the case of the focus control by the contrast method, shading is not necessary. Therefore, the apertures 12 are not necessary.

By employing the above configuration, the solid-state imaging device 1 can perform the focus control by comparing the contrast difference between the pixel signal obtained by the photoelectric conversion film 52 of the upper-side substrate 11A and the pixel signal obtained by the photodiodes 71 of the lower-side substrate 11B.

Note that, in the configuration illustrated in FIG. 13, the three layers of the photoelectric conversion films 52 are formed on the top surface of the upper-side substrate 11A. Therefore, the light entering the photodiodes 71 of the lower-side substrate 11B is near infrared light and the like other than visible light.

Figure 14:
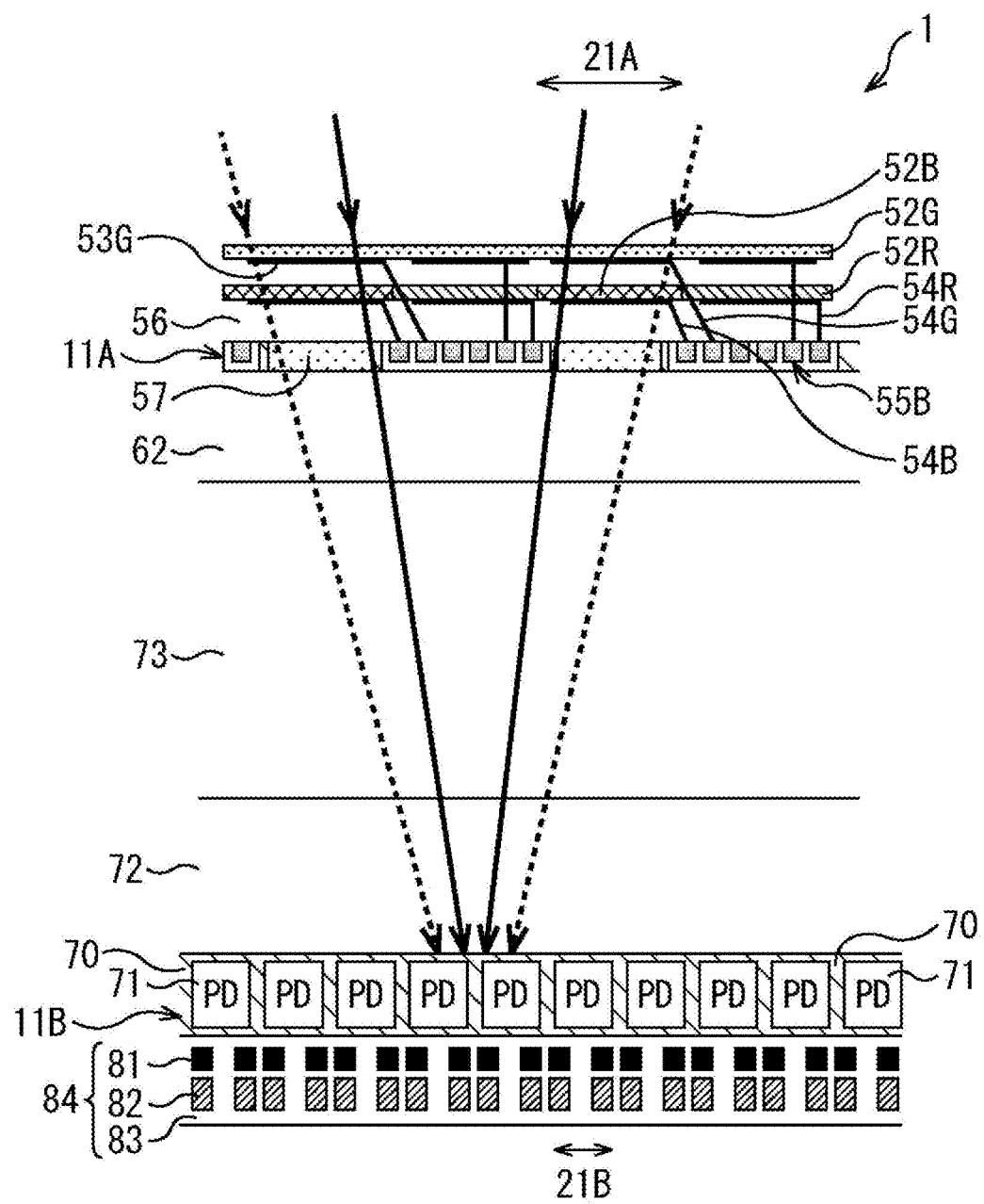
FIG. 14 is a sectional configuration diagram illustrating a modification of the fourth embodiment.

In contrast, as illustrated in FIG. 14, for example, in a case where the number of layers of the photoelectric conversion films 52 formed on the top surface of the upper-side substrate 11A is two, any one of R light, G light, and B light can be received by the photodiodes 71 of the lower-side substrate 11B. Then, the focus control can be performed by comparing the image signal obtained in the photodiodes 71 of the lower-side substrate 11B and the pixel signal obtained in the photoelectric conversion film 52 of the upper-side substrate 11A, which photoelectrically converts light of the same color as the light that can be received in the lower-side substrate 11B. In the configuration example of FIG. 14, the focus control can be performed by comparing a contrast difference between the pixel signal obtained in the red photoelectric conversion film 52R of the upper-side substrate 11A and the pixel signal obtained in the photodiodes 71 of the lower-side substrate 11B.

Further, in the fifth embodiment, a laminate structure with three substrates 11 can be employed, as described in FIGS. 9 to 11.

6. Application Examples to Electronic Equipment

The above-described solid-state imaging device 1 can be applied to various types of electronic equipment including imaging apparatuses such as a digital still camera and a digital video camera, a mobile phone device having an imaging function, and an audio player having an imaging function.

Figure 15:
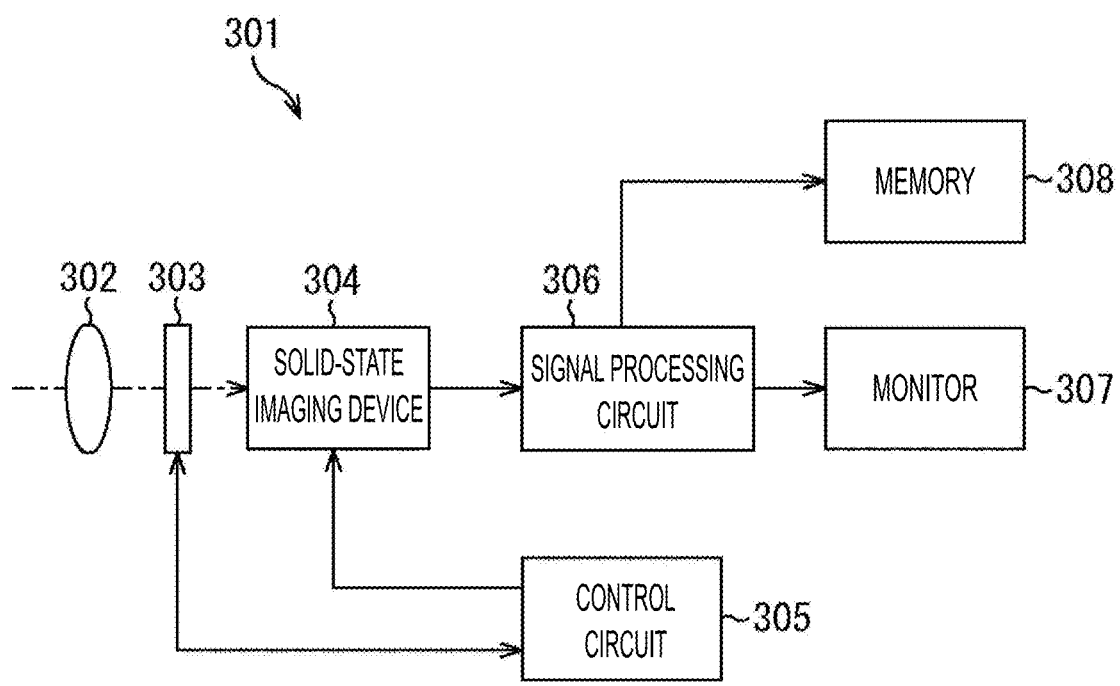
FIG. 15 is a block diagram illustrating a configuration example of an imaging apparatus as electronic equipment according to the present disclosure.

FIG. 15 is a block diagram illustrating a configuration example of the imaging apparatus as the electronic equipment according to the present disclosure.

An imaging apparatus 301 illustrated in FIG. 15 is configured from an optical system 302, a shutter device 303, a solid-state imaging device 304, a control circuit 305, a signal processing circuit 306, a monitor 307, and a memory 308, and can image a still image and a moving image.

The optical system 302 includes one or a plurality of lenses, guides light (incident light) from an object to the solid-state imaging device 304, and forms an image on a light-receiving surface of the solid-state imaging device 304.

The shutter device 303 is arranged between the optical system 302 and the solid-state imaging device 304, and controls an irradiation period and a shading period for the solid-state imaging device 304 according to control of the control circuit 305.

The solid-state imaging device 304 is configured from the above-described solid-state imaging device 1. The solid-state imaging device 304 accumulates signal charges for a fixed period according to light imaged on a light-receiving surface through the optical system 302 and the shutter device 303. The signal charges accumulated in the solid-state imaging device 304 is transferred according to a drive signal (timing signal) supplied from the control circuit 305. The solid-state imaging device 304 may be configured as a one chip alone, or may be configured as a part of a camera module packaged with the optical system 302, the signal processing circuit 306, or the like.

The control circuit 305 outputs the drive signals that control a transfer operation of the solid-state imaging device 304 and a shutter operation of the shutter device 303 to drive the solid-state imaging device 304 and the shutter device 303.

The signal processing circuit 306 applies various types of signal processing to a pixel signal output from the solid-state imaging device 304. An image (image data) obtained by applying the signal processing by the signal processing circuit 306 is supplied to and displayed on the monitor 307, and is supplied to and stored (recorded) in the memory 308.

By using the solid-state imaging device 1 according to the above-described embodiments as the solid-state imaging device 304, auto focus with high speed and high accuracy, which suppresses occurrence of shading can be realized. Therefore, image quality of a captured image can be improved in the imaging apparatus 301 such as a video camera, a digital still camera, or a camera module for mobile equipment such as a mobile telephone device.

Embodiments of the present disclosure are not limited to the above-described embodiments, and various changes can be made without departing from the gist of the present disclosure.

As the substrate 11, either an impurity-region configuration in which electrons are the signal charges or an impurity-region configuration in which positive holes are the signal charges may be employed. Further, in the above-described embodiments, the transistor circuits 55 and 81 as the charge detectors have been formed on the substrate 11 (silicon substrate). However, the transistor circuits 55 and 81 may be organic transistors.

Embodiments of the present disclosure are not limited to the above-described embodiments, and various changes can be made without departing from the gist of the present disclosure.

For example, a form of a combination of all or a part of the plurality of embodiments may be employed.

Note that the effects described in the present specification are merely examples and are not limited. Effects other than those described in the present specification may be exhibited.

Note that the present disclosure may employ configurations below.

(1)

A solid-state imaging device in which two or more layers of photoelectric conversion layers, each of the photoelectric conversion layers including a photoelectric converter and a charge detector, are laminated, the solid-state imaging device including a state in which light having entered one pixel of a first photoelectric conversion layer closer to an optical lens is received in the photoelectric converter of a plurality of pixels of a second photoelectric conversion layer farther from the optical lens.

(2)

The solid-state imaging device according to (1), wherein the photoelectric converter of the first photoelectric conversion layer is configured from a photoelectric conversion film.

(3)

The solid-state imaging device according to (1) or (2), wherein
the photoelectric conversion film is an organic photoelectric conversion film.

(4)

The solid-state imaging device according to (1) or (2), wherein
the photoelectric conversion film is an inorganic photoelectric conversion film.

(5)

The solid-state imaging device according to any of (1) to (4), wherein
the photoelectric converter of the first photoelectric conversion layer is configured from two or more layers of photoelectric conversion films.

(6)

The solid-state imaging device according to any of (1) to (5), wherein
the photoelectric converter of the first photoelectric conversion layer is configured from three layers of the photoelectric conversion films.

(7)

The solid-state imaging device according to (6), wherein
the three layers of the photoelectric conversion films are a first photoelectric conversion film that photoelectrically converts light with a blue wavelength, a second photoelectric conversion film that photoelectrically converts light with a green wavelength, and a third photoelectric conversion film that photoelectrically converts light with a red wavelength.

(8)

The solid-state imaging device according to any of (1) to (5), wherein
the photoelectric converter of the first photoelectric conversion layer is configured from two layers of the photoelectric conversion films.

(9)

The solid-state imaging device according to (8), wherein
a first layer of the two layers of the photoelectric conversion films is the photoelectric conversion film that photoelectrically converts light of any one of red color, green color, and blue color, and
a second layer of the two layers of the photoelectric conversion films is the photoelectric conversion film that photoelectrically converts light of remaining two colors of the red color, the green color, and the blue color.

(10)

The solid-state imaging device according to (9), wherein
the first layer of the first photoelectric conversion film photoelectrically converts the light of the green color, and
the second layer of the second photoelectric conversion film photoelectrically converts the light of the red color and the blue color.

(11)

The solid-state imaging device according to any of (1) to (10), wherein the charge detector is configured from a transistor circuit formed on a silicon layer.

(12)
The solid-state imaging device according to any of (1) to (11), wherein
the photoelectric converter of the second photoelectric conversion layer is configured from a photodiode.

(13)
The solid-state imaging device according to any of (1) to (12), wherein
a pixel signal obtained in the plurality of pixels of the second photoelectric conversion layer is a signal for phase difference detection.

(14)
The solid-state imaging device according to any of (1) to (12), wherein
a pixel signal obtained in the first photoelectric conversion layer and a pixel signal obtained in the second photoelectric conversion layer are compared, and focus control is performed.

(15)
The solid-state imaging device according to any of (1) to (14), wherein
pixels of the first photoelectric conversion layer include a pixel that transmits the light to the second photoelectric conversion layer, and a pixel that does not transmit the light to the second photoelectric conversion layer.

(16)
The solid-state imaging device according to any of (1) to (15), wherein
the first photoelectric conversion layer and the second photoelectric conversion layer are formed using two semiconductor substrates.

(17)
The solid-state imaging device according to any of (1) to (16), wherein
the semiconductor substrate on which the charge detector of the first photoelectric conversion layer is formed is a front surface irradiation-type semiconductor substrate.

(18)
The solid-state imaging device according to any of (1) to (16), wherein
the semiconductor substrate on which the charge detector of the first photoelectric conversion layer is formed is a back surface irradiation-type semiconductor substrate.

(19)
The solid-state imaging device according to any of (1) to (18), wherein
a semiconductor substrate on which a signal processing circuit is formed is laminated, in addition to the two semiconductor substrates on which the first photoelectric conversion layer and the second photoelectric conversion layer are formed.

(20)
Electronic equipment including:
a solid-state imaging device in which
two or more layers of photoelectric conversion layers, each of the photoelectric conversion layers including a photoelectric converter and a charge detector, are laminated, and
a state in which light having entered one pixel of a first photoelectric conversion layer closer to an optical lens is received in the photoelectric converter of a plurality of pixels of a second photoelectric conversion layer farther from the optical lens is included.

REFERENCE SIGNS LIST

1 Solid-state imaging device
2 Optical lens
11A and 11B Semiconductor substrate
12 Aperture
11D and 11E Semiconductor substrate
21A and 21B Pixel
22 On-chip lens
31 Opening portion
51 Silicon layer
52 Photoelectric conversion film
53 Transparent electrode
54 Connection electrode
55 Transistor circuit
70 Silicon layer
71 Photodiode
201 Silicon layer
211 Transistor circuit
301 Imaging apparatus
304 Solid-state imaging device

The invention claimed is:

1. A light detecting device comprising:
an organic photoelectric conversion film;
a first semiconductor substrate including a photodiode;
a first multi-layer wiring layer;
a second semiconductor substrate including a circuit;
a second multi-layer wiring layer; and
a transparent layer between the organic photoelectric conversion film and the first semiconductor substrate;
wherein the first multi-layer wiring layer and the second multi-layer wiring layer are disposed between the first semiconductor substrate and the second semiconductor substrate, and
wherein a first wiring of the first multi-layer wiring layer and a second wiring of the second multi-layer wiring layer are bonded.

2. The light detecting device of claim 1, wherein the organic photoelectric conversion film comprises three photoelectric conversion layers.

3. The light detecting device of claim 1, wherein the circuit comprises a signal processing circuit including a plurality of transistor circuits formed on a silicon layer of the second semiconductor substrate.

4. The light detecting device of claim 1, further comprising an intermediate layer, wherein a thickness of the intermediate layer is associated with a focal length.

5. The light detecting device of claim 4, wherein the intermediate layer is disposed between the transparent layer and the first semiconductor substrate.

6. The light detecting device of claim 5, further comprising a lens, wherein light passing through the lens is received by the photodiode.

7. The light detecting device of claim 4, further comprising a protection film between the intermediate layer and the first semiconductor substrate.

8. The light detecting device of claim 1, wherein the first wiring and the second wiring are bonded by Cu—Cu metal coupling.

9. The light detecting device of claim 1, further comprising a third multi-layer wiring layer formed on a side of the transparent layer opposite to a light-incident side of the transparent layer.

10. The light detecting device of claim 1, wherein the transparent layer is formed of oxidized silicon.

11. An electronic apparatus comprising a light detecting device, the light detecting device comprising:

an organic photoelectric conversion film;
a first semiconductor substrate including a photodiode;
a first multi-layer wiring layer;
a second semiconductor substrate including a circuit;
a second multi-layer wiring layer; and
a transparent layer between the organic photoelectric conversion film and the first semiconductor substrate;
wherein the first multi-layer wiring layer and the second multi-layer wiring layer are disposed between the first semiconductor substrate and the second semiconductor substrate, and
wherein a first wiring of the first multi-layer wiring layer and a second wiring of the second multi-layer wiring layer are bonded.

12. The electronic apparatus of claim 11, wherein the organic photoelectric conversion film comprises three photoelectric conversion layers.

13. The electronic apparatus of claim 11, wherein the circuit comprises a signal processing circuit including a plurality of transistor circuits formed on a silicon layer of the second semiconductor substrate.

14. The electronic apparatus of claim 11, further comprising an intermediate layer, wherein a thickness of the intermediate layer is associated with a focal length.

15. The electronic apparatus of claim 14, wherein the intermediate layer is disposed between the transparent layer and the first semiconductor substrate.

16. The electronic apparatus of claim 15, further comprising a lens, wherein light passing through the lens is received by the photodiode.

17. The electronic apparatus of claim 14, further comprising a protection film between the intermediate layer and the first semiconductor substrate.

18. The electronic apparatus of claim 11, wherein the first wiring and the second wiring are bonded by Cu—Cu metal coupling.

19. The electronic apparatus of claim 11, further comprising a third multi-layer wiring layer formed on a side of the transparent layer opposite to a light-incident side of the transparent layer.

20. The electronic apparatus of claim 11, wherein the transparent layer is formed of oxidized silicon.

* * * * *